United States Patent [19]

Burgoon

[11] 4,283,691
[45] Aug. 11, 1981

[54] CRYSTAL OSCILLATOR HAVING LOW NOISE SIGNAL EXTRACTION CIRCUIT

[75] Inventor: John R. Burgoon, Campbell, Calif.

[73] Assignee: Hewlett-Packard Company, Palo Alto, Calif.

[21] Appl. No.: 43,591

[22] Filed: May 29, 1979

[51] Int. Cl.³ .............................................. H03B 5/36
[52] U.S. Cl. ................................. 331/116 R; 331/158
[58] Field of Search ............. 331/116 R, 116 FE, 158, 331/159

[56] References Cited

U.S. PATENT DOCUMENTS

| | | | |
|---|---|---|---|
| 2,745,010 | 5/1956 | Stansel | 331/116 R |
| 3,743,968 | 7/1973 | Miyake et al. | 331/116 R |
| 3,803,828 | 4/1974 | Keeler et al. | 331/116 FE |
| 3,916,344 | 10/1975 | Enderby | 331/116 R |

Primary Examiner—Siegfried H. Grimm
Attorney, Agent, or Firm—Allston L. Jones

[57] ABSTRACT

A method and apparatus for minimizing the noise component of the output signal from a resonator oscillator. A single transistor or Darlington pair of transistors in the common base configuration is placed in series with the crystal resonator of the oscillator with a selected output load impedance connected between the base and collector of the transistors. By making use of this configuration, it is possible to use the crystal resonator as an initial filter to minimize the noise component of the output signal contributed by the oscillator loop as well as minimizing the inherent noise component from the output buffer amplifiers in the output signal. A common base configuration of both of these embodiments provides a low impedance load on the oscillator loop thus minimizing the effect on tuning or Q of the oscillator while making it possible to select an output impedance load that is of sufficient size to present an output signal having a sufficiently high signal to noise ratio to provide the minimization sought.

9 Claims, 12 Drawing Figures

CRYSTAL OSCILLATOR HAVING LOW NOISE SIGNAL EXTRACTION CIRCUIT

BACKGROUND AND SUMMARY OF THE INVENTION

This invention is concerned generally with oscillators, and more particularly with resonator oscillators having means for extracting the signal developed by the oscillator with a low noise component.

Oscillators basically consist of an oscillating loop from which power is extracted through the use of amplifiers. In the prior art, the signal extraction techniques generally involved monitoring the voltage across one of the circuit elements within the oscillating loop and amplifying that voltage. For oscillators that utilize crystal resonators, this technique results in a rather high noise component in the output signal. This noise is contributed by basically two sources, the oscillation loop which includes an inverting amplifier and the buffer amplifiers that are used for extracting the signal from the oscillating loop. To minimize the noise contributed by the oscillator loop in the output signal, a voltage proportional to the current through the resonator can be used as the output signal. This reduces the noise component contributed by the oscillator loop since the cleanest signal in the oscillator is the current through the resonator wherein the resonator acts as a filter. This can be done by putting a small impedance element in series with the resonator and using the voltage developed across that element as the output signal.

To obtain a high signal to noise ratio that is minimally affected by the inherent noise in the output buffer amplifier, a high output signal voltage is desired. If the impedance of the circuit element across which the output signal is generated were increased substantially in either of the above-discussed techniques, the tuning or Q of the oscillator loop would be greatly disturbed.

A circuit that presents a low impedance to the oscillator loop and a high impedance to the output buffer amplifiers without disturbing the tuning or Q of the oscillator is highly desirable. A circuit with these characteristics would, therefore, minimize the noise effects from both the oscillator loop and the buffer amplifiers. The present invention presents such a circuit.

In accordance with the preferred embodiment, the present invention includes a resonator oscillator having a crystal resonator connected in series between the input and output terminals of an inverting amplifier. In addition, there is an active output means connected in series with the crystal resonator for presenting a low impedance to the oscillator loop and for generating a high signal to noise ratio output signal in response to the current flowing through the crystal resonator.

In both embodiments of the present invention the active output means includes transistor means and an output impedance means coupled to the transistor means for developing a high signal to noise ratio output signal thereacross. In the first embodiment the transistor means includes a single transistor connected serially with the crystal resonator in a common base configuration. This transistor is connected so that the base and emitter are connected serially with the crystal resonator between the input and output terminals of the inverting amplifier. The output impedance means is then connected between the collector and base of this transistor. This configuration makes use of the natural filtering of the crystal resonator and it is this filtering characteristic that minimizes the effect of the noise from the oscillator loop in the output signal. By placing the transistor in series with the resonator, the resonator current is detected by the transistor and a nearly equivalent current is supplied to the output impedance means. The common base configuration of the transistor means also provides a low impedance to the oscillator loop thus making it possible to increase the impedance of the output impedance element to produce an output signal with a selected signal to noise ratio.

The second embodiment of the present invention includes the resonator oscillator as described above with the single transistor replaced with a Darlington pair and having this Darlington pair connected in the common base configuration. Through the use of the Darlington pair configuration the output noise power is reduced by the product of the DC base to emitter current gain of each of the two transistors. In the first embodiment the noise power is reduced by the singular base to emitter current gain of the one transistor.

DESCRIPTION OF THE PREFERRED EMBODIMENT

Figure 1:
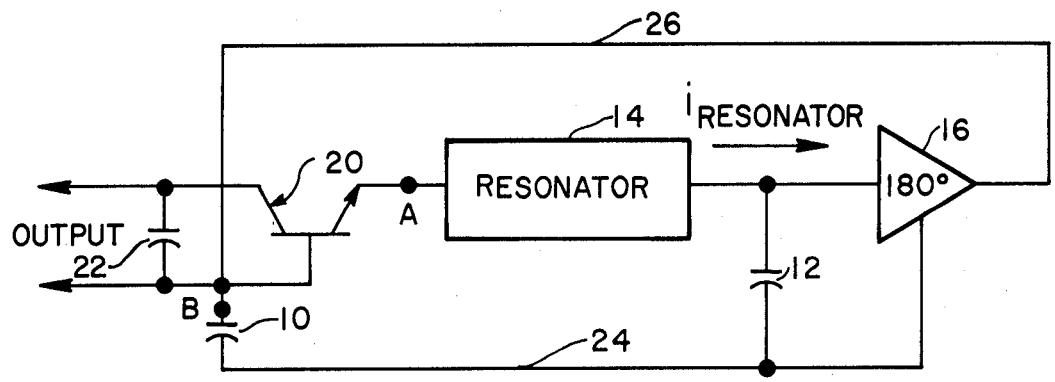
FIG. 1 is a schematic diagram of one embodiment of the present invention.

FIG. 1 shows a simplified oscillator circuit that includes one embodiment of the present invention. In this figure, there are two shunt capacitors 10 and 12, a crystal resonator 14, an inverting amplifier 16, common base transistor 20 and an output capacitor 22. One end of crystal resonator 14 is connected to the input of inverting amplifier 16 and one end of shunt capacitor 12. The output of inverting amplifier 16 is fed back via feedback path 26 to one end of shunt capacitor 10. The second end of each of shunt capacitors 10 and 12, as well as the reference line of inverting amplifier 16, are connected to the reference line 24. Transistor 20 has its emitter connected to the second end of crystal resonator 14, its collector connected to one end of output capacitor 22 and its base connected to feedback path 26. The second end of output capacitor 22 is also connected to feedback path 26, with the output voltage of the oscillator being developed across output capacitor 22.

In this configuration, output capacitor 22 is effectively in series with crystal resonator 14 with the current flowing through that capacitor substantially equal to the resonator current, (i.e. $\alpha\ I_{resonator}$). Since, as is discussed in the Background, resonator 14 acts as a filter to minimize the oscillator loop noise generated predominantly by inverting amplifier 16, the oscillator loop noise component in the output signal is minimized. Looking back into points A and B within the oscillator circuit toward the common base transistor 20, the oscillator loop sees a low impedance that is substantially equal to $r_e + r_b/\beta$ wherein $r_e$ is the internal incremental emitter resistance of transistor 20, $r_b$ is the internal incremental base spreading resistance of transistor 20, and $\beta$ is the DC current gain from the base to the emitter of transistor 20. Since $r_e$ and $r_b$ are inherently small, and $\beta$ is inherently large, the impedance that transistor 20 presents to the remainder of the oscillator circuit is very small. Thus, the impedance of the output circuit has only a minimal affect on the Q and tuning of the oscillator itself. Therefore, output capacitor 22 is isolated from the oscillator circuit making it possible to increase the impedance of output capacitor 22 to increase the amplitude of the output signal and to minimize the noise effect of the output buffer stages (not shown) (i.e. maximize the signal-to-noise ratio) without affecting the tuning or the Q of the oscillator. Output buffer amplifiers could be any one of a well known group of amplifiers, the simplest being a single common emitter amplifier stage.

Figure 2:
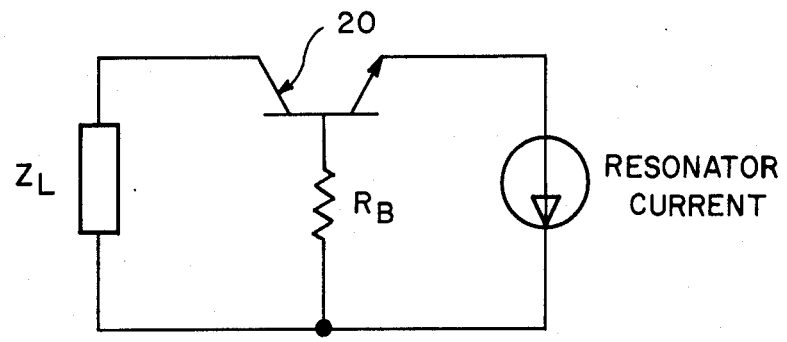
FIG. 2 is a simplified schematic diagram of the embodiment of the present invention shown in FIG. 1.

Since crystal resonator 14 minimizes the oscillator loop noises in the resonator current, the circuit of FIG. 1 can be redrawn in a much simpler form to examine the noise signals generated by common base transistor 20. That simpler form is shown in FIG. 2 which includes common base transistor 20, base resistance $R_B$, a resonator current source, and a load impedance, $Z_L$. Base resistor $R_B$ has one end connected to the base of transistor 20 and its second end connected to one end of load impedance $Z_L$ and the output end of the resonator current source. The collector of transistor 20 is connected to the second end of load impedance $Z_L$ and its emitter is connected to the return end of the resonator current source. In this Figure the bulk of the oscillator loop has been lumped together to form the resonator current source and the output capacitor 22 is shown in a more general form as load impedance $Z_L$.

Common base transistor 20 in series with crystal resonator 14 presents another very important benefit. If the circuit is again broken at points A and B of FIG. 1, the impedance looking into crystal resonator 14 appears to be an open circuit when the resonator 14 is off resonance. Therefore, only the base recombination noise of common base transistor 20 contribute to the output noise ratio. To evaluate the effect of the recombination noise the simplified circuit of FIG. 2 is redrawn in FIG. 3 using the common base tee model with all the noise sources included.

Figure 3:
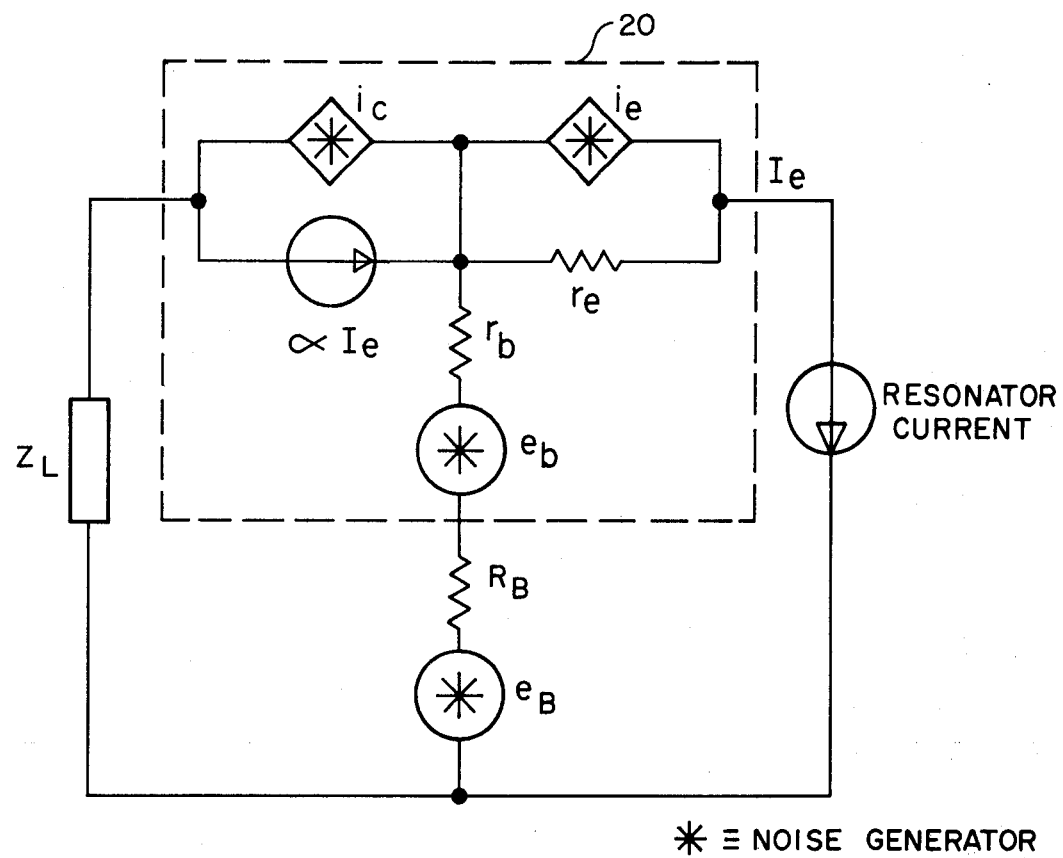
FIG. 3 is a schematic representation of the simplified circuit shown in FIG. 2 with transistor 20 being redrawn in the common base tee equivalent circuit with the various noise sources added.
Figure 4:
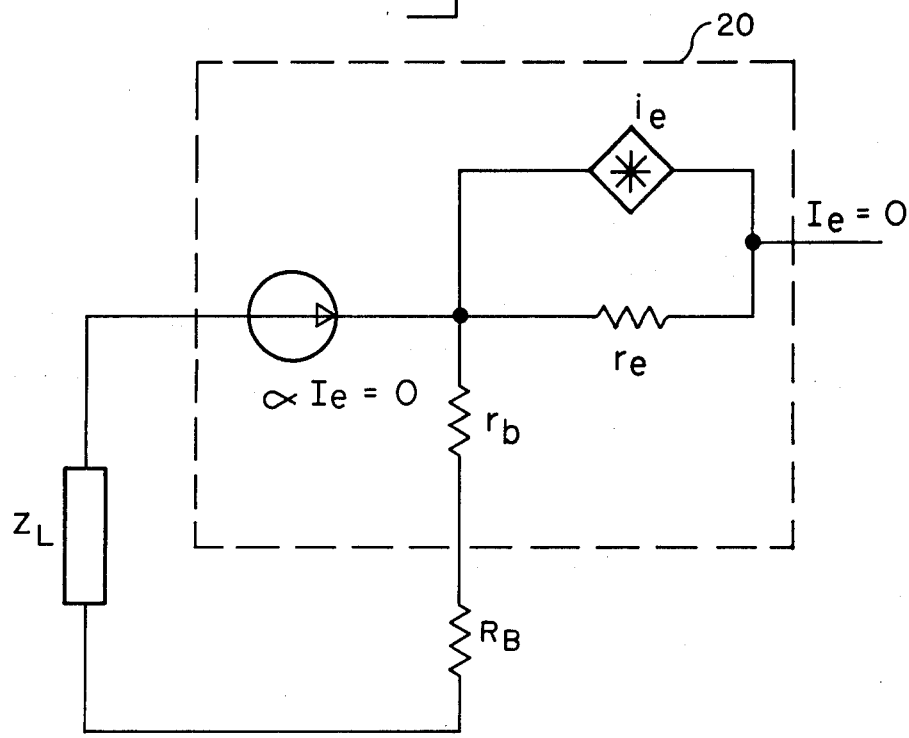
FIG. 4 is a schematic representation of the circuit shown in FIG. 3 being redrawn to show the effect of noise source $i_e$ utilizing the technique of superposition.
Figure 5:
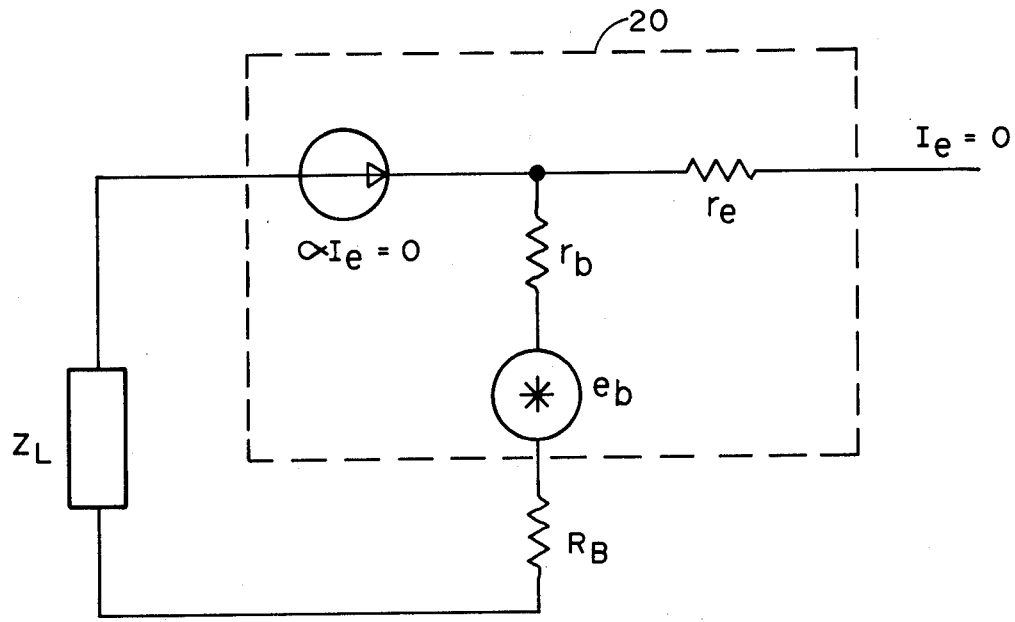
FIG. 5 is a schematic representation of the circuit of FIG. 3 having been redrawn to show the effect of noise source $e_b$ through the technique of superposition.

Evaluation of the effects of each of the noise sources shown in FIG. 3 on the output voltage taken across impedance $Z_L$ is done by superposition. This is done by examining the effect of each noise source by open circuiting the other independent current sources and short circuiting each of the other independent voltage sources. In FIG. 4, the circuit of FIG. 3 is redrawn to show the effect of noise source $i_e$. Since $I_e$ is equal to zero, (i.e. resonator current source is open circuited) the dependent generator $\alpha\ I_e$ is also equal to zero thus there is no effect on the output as a result of noise source $i_e$. For noise sources $e_b$ the circuit has been redrawn in FIG. 5. Again, in this view $I_E$ is equal to zero since the resonator current source has been open circuited for this analysis and as a result the dependent current source $\alpha\ I_e$ is again equal to zero, thus there is no effect on the output voltage across $Z_L$ as a result of noise source voltage $e_b$. By this same analysis, the noise source voltage $e_B$ also has no effect on the output voltage. From FIG. 3, by a similar superposition technique one can readily see that the noise current $i_c$ will flow through load impedance $Z_L$ and thus appear with the output voltage. Therefore, the base recombination noise current $i_c$, is the only noise component that appears in the output signal for the circuit of FIG. 1.

Figure 7:
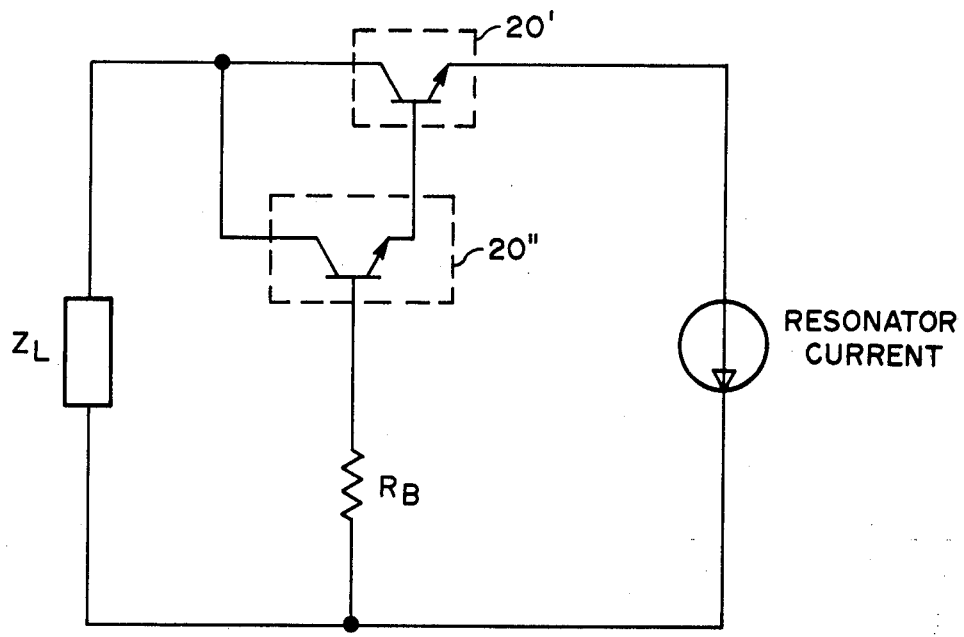
FIG. 7 is a simplified schematic representation of the circuit shown in FIG. 6.

FIG. 7 shows a circuit that is similar to the circuit of FIG. 1 with the single common base transistor of FIG. 1 having been replaced with transistors 20' and 20''. In this Figure, transistors 20' and 20'' are connected in the Darlington configuration and this Darlington pair is connected in a common base configuration as was single transistor 20 in FIG. 1. This circuit works in the same manner as the circuit in FIG. 1 with the exception that the Darlington pair has the effect of reducing the noise level in the output signal from the oscillator.

Figure 6:
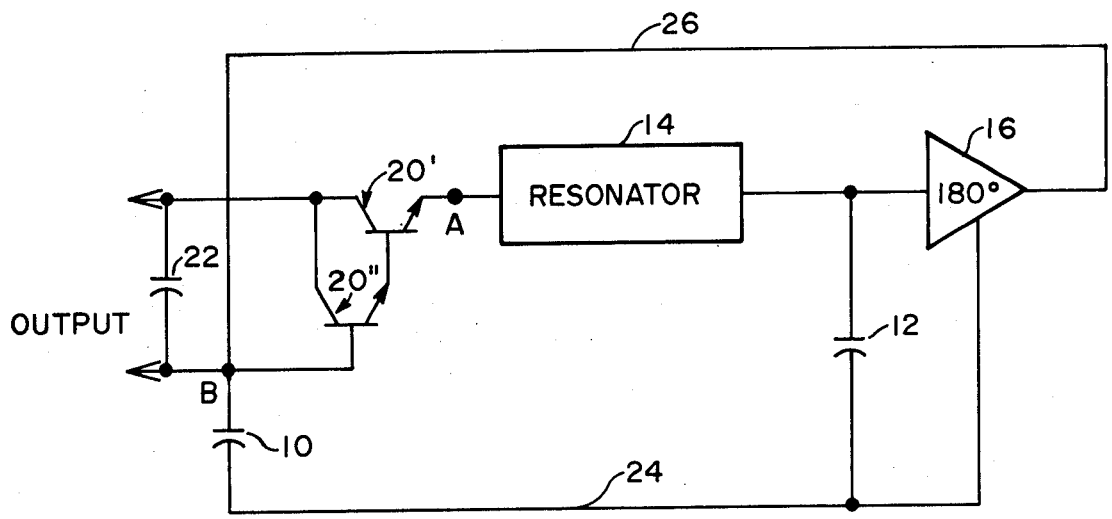
FIG. 6 is a schematic representation of another embodiment of the present invention.
Figure 8:
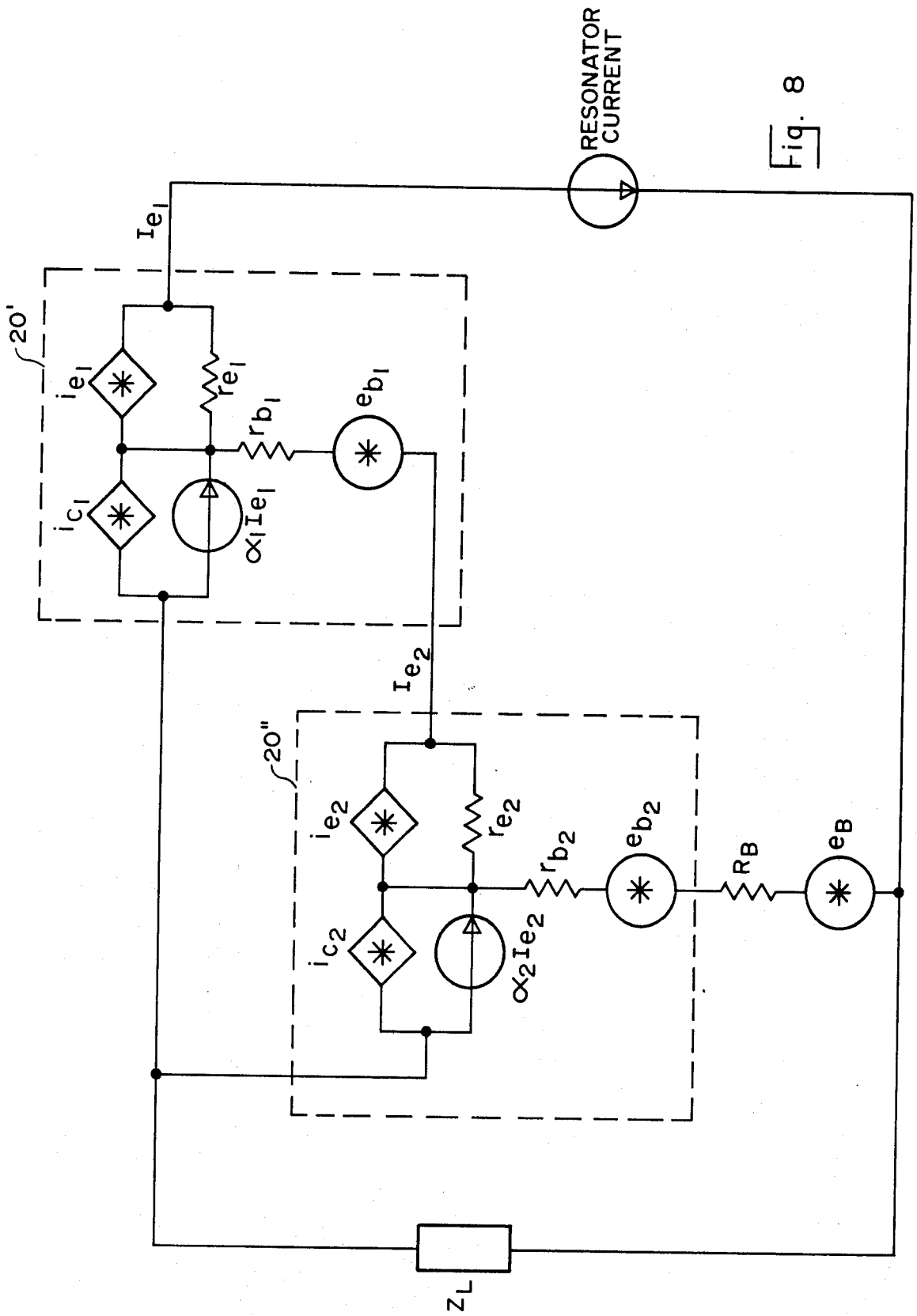
FIG. 8 is a schematic representation of the circuit shown in FIG. 7 wherein transistors 20' and 20" have been replaced with their common base tee equivalent circuit with the various noise sources added.
Figure 9:
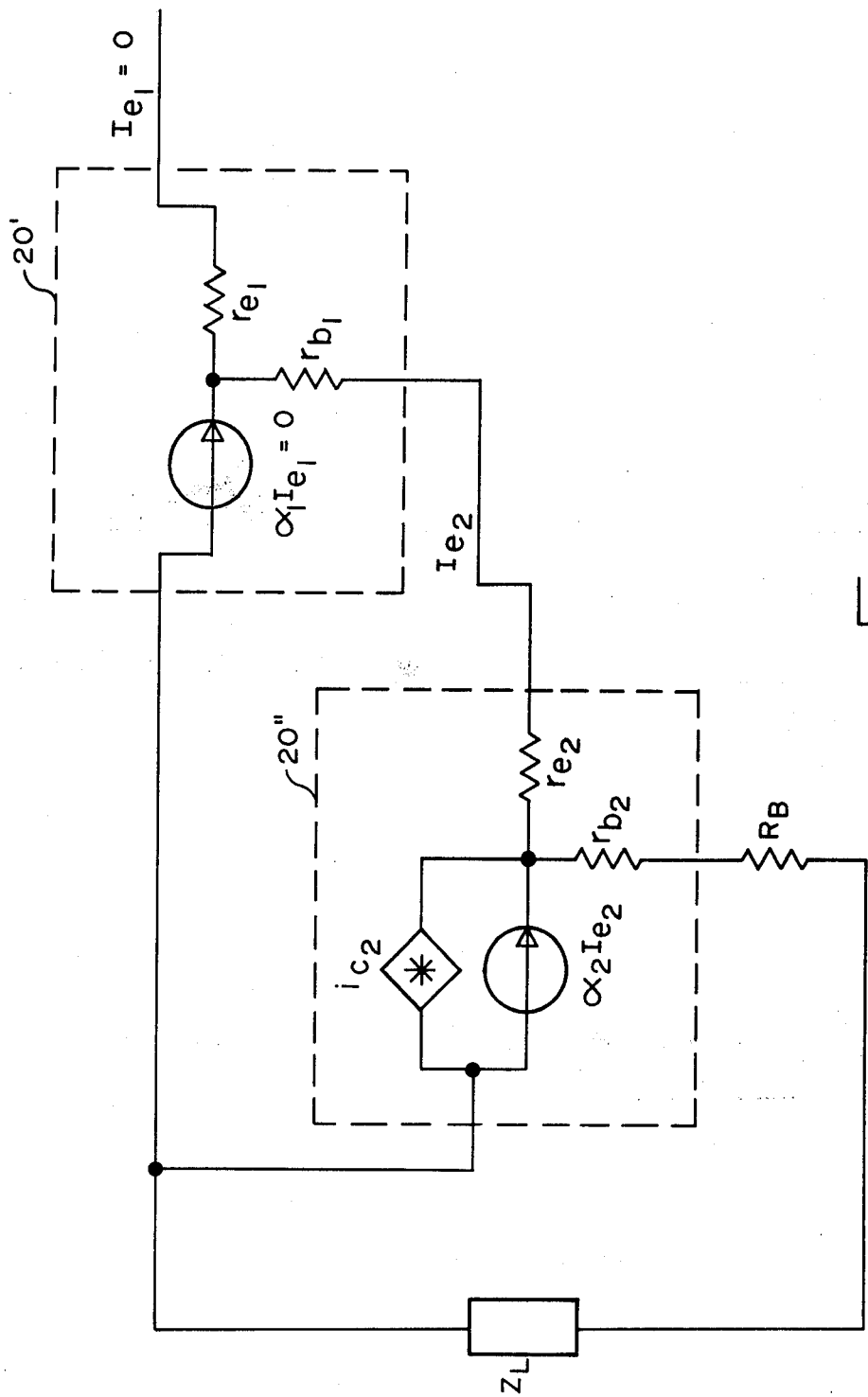
FIG. 9 is a schematic representation of the circuit shown in FIG. 8 having been redrawn to show the singular effect of noise source $i_{c2}$ through the application of the technique of superposition.
Figure 10:
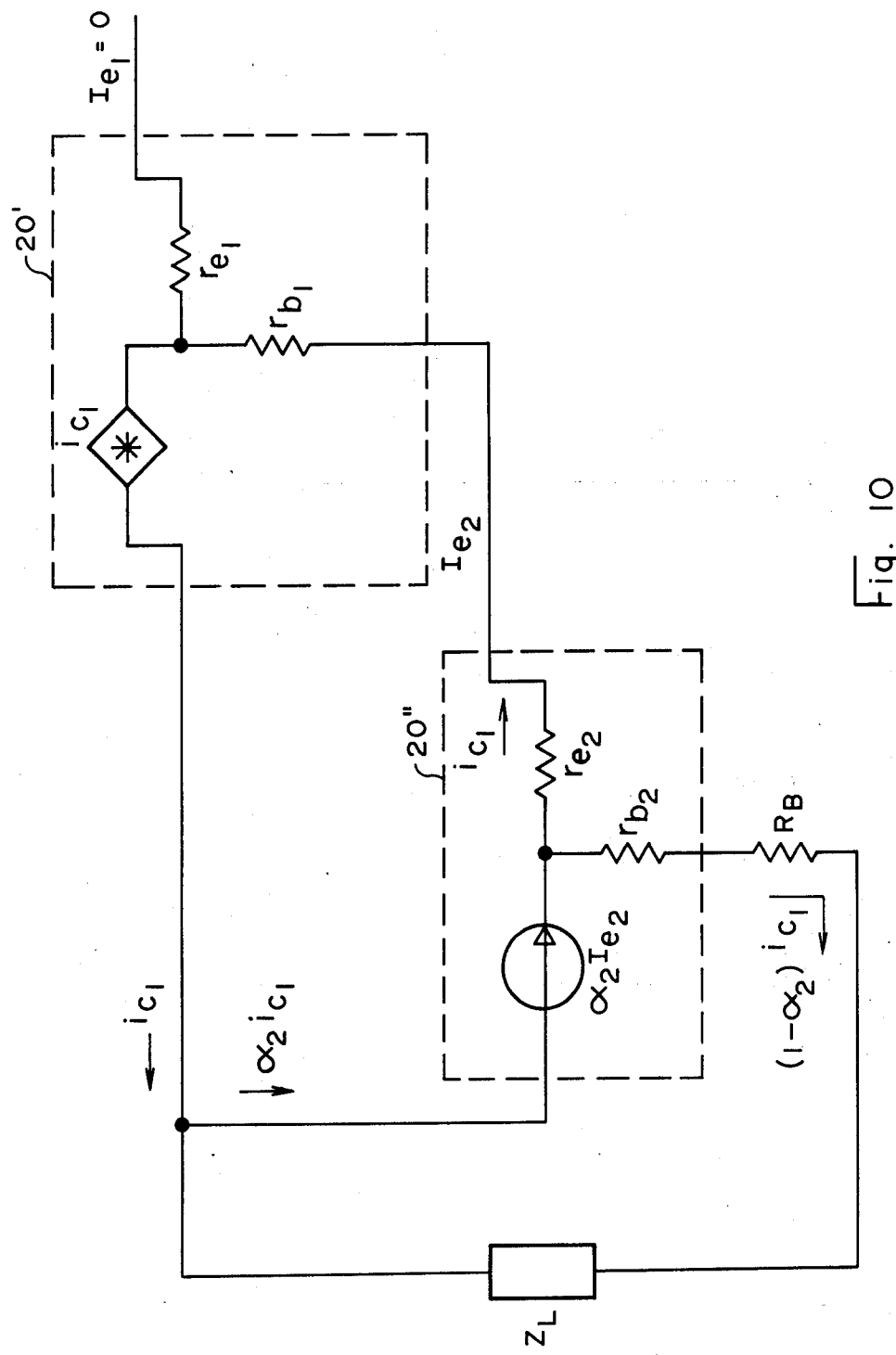
FIG. 10 is a schematic representation of the circuit shown in FIG. 8 to show the singular effect of noise source $i_{c1}$ through the utilization of the technique of superposition.

The circuit of FIG. 6 can also be redrawn in the simplified form shown in FIG. 7 for the same reasons as discussed above for the circuit in FIG. 1 being redrawn as shown in FIG. 2. Then in FIG. 8 the circuit of FIG. 7 has been redrawn utilizing the common base tee model for transistors 20' and 20'' as was done in FIG. 3 for the circuit of FIG. 2. By again applying the technique of superposition, we can see that noise source $i_{e1}$ and $e_{b1}$ of transistor 20', $i_{e2}$ and $e_{b2}$ of transistor 20'', and $e_b$ have no effect on the output voltage taken across impedance $Z_L$, by analysis similar to that used in relation to FIGS. 4 and 5. In order to show the effect of the base recombination noise current of transistor 20'' (i.e. $i_{c2}$) on the output voltage, the circuit of FIG. 8 has been redrawn as FIG. 9 with each of the independent current sources open circuited and each of the independent voltage sources short circuited. From this Figure since $I_{e1}$ is equal to zero and therefore dependent current source $\alpha_1\ I_{e1}$ is also equal to zero, we can see that current $I_{e2}$ is also zero. Since current $I_{e2}$ is zero, therefore, dependent current sources $\alpha_2\ I_{e2}$ is also zero. Since the base recombination noise current, $i_{c2}$ is in parallel with this last-mentioned dependent current source, this current flows through the load impedance $Z_L$ and thus appears in the output voltage signal. Similarly, the circuit of FIG. 8 has been redrawn in FIG. 10 to show the effect of the base recombination noise current of transistor 20' (i.e. $i_{c1}$) on the output signal from the oscillator. From this Figure we can see that the current $I_{e2}$ is equivalent to $i_{c1}$, and thus dependent current source $\alpha_2\ I_{e2}$ is equal to $\alpha_2\ i_{c1}$.

Therefore, the current through load impedance $Z_L$ contributed by base recombination noise current $i_{c1}$ is equal to $(1-\alpha_2) i_{c1}$.

To show the additional noise reduction effect of the Darlington pair, the following equations are offered:

From the analysis above, the total noise power in $Z_L$ is:

$$i_T^2 = i_{c2}^2 + (1 - \alpha_2)^2 i_{c1}^2 \quad (1)$$

and since the square of the base recombination noise current, $i_c$ by a well known relationship is $$i_c^2 = 2qI_B \quad (2)$$

wherein q is the charge on an electron, and $I_B$ is the D.C. component of the base current.

Another well known relationhsip is $$(1 - \alpha_2)^2 = \frac{1}{\beta_2^2} \quad (3)$$

where $\alpha_2$ and $\beta_2$ are A.C. current gains for transistor 20''.

By substituting equations (2) and (3) in equation (1), we obtain $$i_T^2 = 2q\left(I_{B2} + \frac{I_{B1}}{\beta_2^2}\right) \quad (4)$$

By an additional well known relationship, we obtain $$I_{B1} = \frac{I_{C1}}{\beta_{01}} \quad (5)$$

wherein $I_{B1}$ is the D.C. component of the base current of the transistor 20', $I_{C1}$ is the D.C. component of the collector current of transistor 20', and $\beta_{01}$ is the D.C. base to emitter current gain of transistor 20'.

Also, from FIG. 7 we have $$I_{B1} \cong I_{C2} = \beta_{02} I_{B2} \quad (6)$$

where $I_{B2}$ and $I_{C2}$ are the D.C. components of the base and collector currents, respectively, of transistor 20'', and $\beta_{02}$ is the D.C. base to emitter current gain of transistor 20''.

From equations (5) and (6) we get $$I_{B2} \cong \frac{I_{B1}}{\beta_{02}} = \frac{I_{C1}}{\beta_{01}\beta_{02}} \quad (7)$$

And by substituting the relationships of equations (5) and (7) into equation (4), we get:

$$i_T^2 = 2q\left(\frac{I_{C1}}{\beta_{01}\beta_{02}} + \frac{I_{C1}}{\beta_2^2 \beta_{01}}\right) \quad (8)$$

which simplifies to $$i_T^2 = 2q\frac{I_{C1}}{\beta_{01}}\left(\frac{1}{\beta_{02}} + \frac{1}{\beta_2^2}\right) \quad (9)$$

Since, generally $\beta_2^2 >> \beta_{02}$, equation (9) reduces to:

$$i_T^2 = \frac{2qI_{C1}}{\beta_{01}\beta_{02}} \quad (10)$$

as compared to $$i_T^2 = i_{c1}^2 = 2qI_{B1} = 2q\frac{I_{C1}}{\beta_{01}} \quad (11)$$

for the non-Darlington configuration of FIG. 1.

Thus, the noise power output from the circuit of FIG. 6 is further reduced by $\beta_{02}$, the D.C. current gain of transistor 20'' over that of the circuit of FIG. 1.

Figure 11:
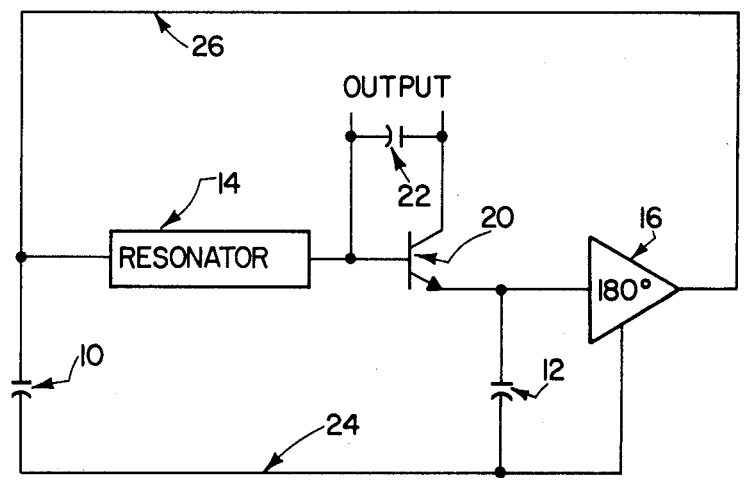
FIG. 11 is a another schematic representation of the embodiment of the invention shown in FIG. 1.
Figure 12:
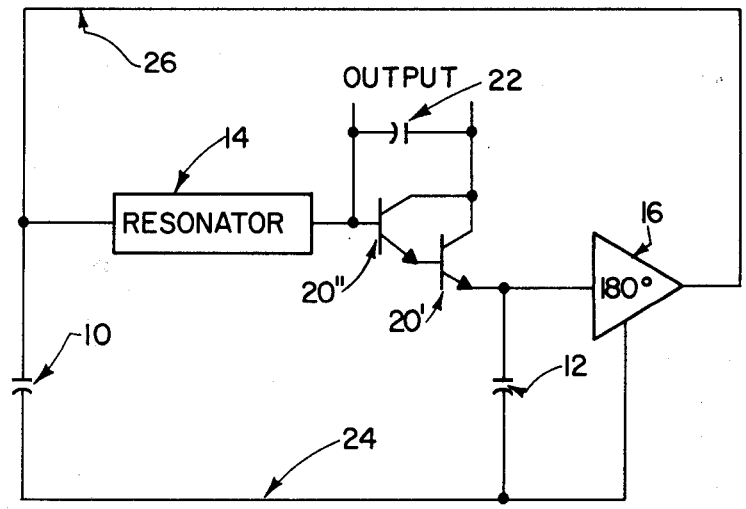
FIG. 12 is another schematic representation of the embodiment of the invention shown in FIG. 6.

FIG. 11 and 12 are schematic representations of two alternative embodiments of the present invention. In each of these embodiments, transistors 20, 20' and 20'' are in series with crystal resonator 14 between it and the junction of the input terminal of the inverting amplifier 16 and one end of capacitor 12, instead of between the junction of the output terminal of the inverting amplifier 16 and one end of capacitor 10 as in FIGS. 1 and 6.

I claim:

1. A resonator oscillator with signal extraction apparatus to minimize the noise power component of the output signal from the oscillator, said oscillator comprising:
   oscillator loop means including:
      inverting amplifier means having an input terminal and an output terminal;
      signal feedback means including:
         crystal resonator means having a current flowing therethrough and having a first end coupled to the input terminal of the inverting amplifier means, and having a second end coupled to the output terminal of the inverting amplifier; and
         first and second shunt reactive means, said first shunt reactive means having one end connected to the input terminal of the inverting amplifier means, and said second shunt reactive means having one end connected to the output terminal of the inverting amplifier means, with the other ends of each of said first and second shunt reactive means being connected one to the other; and
   active output means being connected in series with the crystal resonator means with the current flowing through this means being the current that flows through said crystal resonator means for presenting a low impedance to the oscillator loop, and generating a high signal to noise ratio output signal in response to the crystal resonator current.

2. A resonator oscillator as in claim 1 wherein said active output means includes transistor means, and impedance means coupled to the transistor means for developing a high signal to noise ratio output signal thereacross.

3. A resonator oscillator as in claim 2 wherein said transistor means includes a transistor having a base, a collector and an emitter connected in the common base configuration with the base connected to the junction of the output terminal of the inverting amplifier means and the one end of the second shunt reactive means, the emitter connected to the second end of the crystal resonator means, and the collector connected to one end of the impedance means with the other end of the impedance means connected to the output terminal of the inverting amplifier means.

4. A resonator oscillator as in claim 3 wherein said impedance means comprises a capacitor.

5. A resonator oscillator as in claim 2 wherein said transistor means includes a transistor having a base, a collector and an emitter connected in the common base configuration with the base connected to the first end of the crystal resonator means, the emitter connected to the junction of the input terminal of the inverting amplifier means and the one end of the first shunt reactive means, and the collector connected to one end of the impedance means with the other end of the impedance means connected to base of the transistor means.

6. A resonator oscillator means as in claim 2 wherein said transistor means includes first and second transistors each having a base, a collector, and an emitter, said first and second transistors being connected in the Darlington pair configuration with the collector and emitter of said second transistor being connected to the collector and base, respectively, of the first transistor, said Darlington pair of transistors being connected to the oscillator loop in the common base configuration with the emitter of the first transistor connected to the second end of the crystal resonator means, the base of said second transistor connected to the junction of the output terminal of the inverting amplifier means and the one end of the second shunt reactive means, and the collectors of both of said first and second transistors connected to one end of the impedance means with the 35 other end of the impedance means connected to the output terminal of the inverting amplifier means.

7. A resonator oscillator as in claim 6 wherein said impedance means comprises a capacitor.

8. A resonator oscillator means as in claim 2 wherein said transistor means includes first and second transistors each having a base, a collector and an emitter, said first and second transistors being connected in the Darlington pair configuration with the collector and emitter of said second transistor being connected to the collector and base, respectively, of the first transistor, said Darlington pair of transistors being connected to the oscillator loop in the common base configuration with the emitter of the first transistor connected to the junction of the input terminal of the inverting amplifier means and the one end of the first shunt reactive means, the base of the second transistor connected to the first end of the crystal resonator means, and the collectors of both of said first and second transistors connected to one end of the impedance means with the other end of the impedance means connected to the base of said second transistor.

9. A method of minimizing the noise power in the output signal from a Colpitts type resonator oscillator, including a resonator, the method comprising the steps of:

serially applying the current through the resonator of a Colpitts type oscillator to an active device that presents a low impedance load to the resonator to use the filtering effect of the resonator to minimize the oscillator loop noise component in the output signal; and connecting a selected load impedance to the active device for developing the output signal thereacross, the output signal being isolated from the oscillator loop and having a selected signal to noise ratio to further minimize the noise component in the output signal.

* * * * *

UNITED STATES PATENT AND TRADEMARK OFFICE
CERTIFICATE OF CORRECTION

PATENT NO. : 4,283,691
DATED : August 11, 1981
INVENTOR(S) : John R. Burgoon

It is certified that error appears in the above-identified patent and that said Letters Patent are hereby corrected as shown below:

Column 4, line 46, delete "$e_b$" and insert -- $e_B$ --;

Column 5, delete that portion of equation (4) which reads "$=2_q$" and insert -- $=2q$ --.

Signed and Sealed this

Third Day of November 1981

[SEAL]

Attest:

GERALD J. MOSSINGHOFF

Attesting Officer     Commissioner of Patents and Trademarks